United States Patent [19]
Kaussen et al.

[11] Patent Number: 5,310,701
[45] Date of Patent: May 10, 1994

[54] METHOD FOR FIXING SEMICONDUCTOR BODIES ON A SUBSTRATE USING WIRES

[75] Inventors: Franz Kaussen, Warstein; Martin Figura, Ruethen-Kallenhardt, both of Fed. Rep. of Germany

[73] Assignee: Eupec Europaeische Gesellschaft für Leistungshalbleiter mbH&Co, Warstein-Belecke, Fed. Rep. of Germany

[21] Appl. No.: 3,539

[22] Filed: Jan. 13, 1993

[30] Foreign Application Priority Data

Jan. 24, 1992 [DE] Fed. Rep. of Germany ....... 4201931

[51] Int. Cl.⁵ ..................... H01L 21/58; H01L 21/68
[52] U.S. Cl. .................... 437/209; 437/218; 437/221; 257/783; 361/808; 361/809; 361/825
[58] Field of Search ............... 437/209, 208, 218, 915, 437/221; 257/727, 782, 783; 361/767, 807, 808, 809, 825, 826

[56] References Cited

U.S. PATENT DOCUMENTS

| | | | |
|---|---|---|---|
| 3,370,203 | 2/1968 | Kravitz et al. | 437/208 |
| 3,715,633 | 2/1973 | Nier | 317/234 R |
| 3,962,669 | 6/1976 | Entine et al. | 257/727 |
| 4,661,835 | 4/1987 | Gademann et al. | 357/68 |
| 4,949,148 | 8/1990 | Battelink | 357/74 |

FOREIGN PATENT DOCUMENTS

| | | |
|---|---|---|
| 2814642 | 10/1979 | Fed. Rep. of Germany . |
| 3217345 | 12/1982 | Fed. Rep. of Germany . |
| 3401404 | 7/1985 | Fed. Rep. of Germany . |
| 2098801 | 11/1982 | United Kingdom . |

*Primary Examiner*—Olik Chaudhuri
*Assistant Examiner*—David E. Graybill
*Attorney, Agent, or Firm*—Herbert L. Lerner; Laurence A. Greenberg

[57] ABSTRACT

A method for mounting semiconductor bodies on a substrate includes bonding wires to a substrate being formed of metal at least in given locations. Semiconductor bodies are laterally fixed to the given locations of the substrate with the wires. The semiconductor bodies are subsequently materially joined to the substrate in the given locations.

6 Claims, 1 Drawing Sheet

METHOD FOR FIXING SEMICONDUCTOR BODIES ON A SUBSTRATE USING WIRES

The invention relates to a method for mounting semiconductor bodies on a substrate being formed of metal, at least at locations where the semiconductor bodies are placed, by materially joining the semiconductor bodies to the metal.

Such methods are known in the art. They are used, for instance, where semiconductor bodies are to be joined to metallized insulating substrates. Such composite configurations are the building blocks for power semiconductor modules.

Typically, the semiconductor bodies are soldered to the substrate. Fixing the semiconductor bodies requires solder preforms that are complicated and expensive to make. Moreover, such solder preforms are not versatile, so that a different solder preform is required for each chip size. If the lateral location of the semiconductor bodies on the substrate is changed, then a different solder preform must also be constructed for it.

It is accordingly an object of the invention to provide a method for mounting semiconductor bodies on a substrate, which overcomes the hereinbefore mentioned disadvantages of the heretofore known methods of this general type and which makes do without the aforementioned solder preform.

With the foregoing and other objects in view there is provided, in accordance with the invention, a method for mounting semiconductor bodies on a substrate, which comprises bonding wires to a substrate being formed of metal at least in given locations; laterally fixing semiconductor bodies to the given locations of the substrate with the wires; and subsequently materially joining the semiconductor bodies to the substrate in the given locations.

In accordance with another mode of the invention, there is provided a method which comprises bonding two ends of the wires to the substrate.

In accordance with a further mode of the invention, there is provided a method which comprises bonding one end of the wires to the substrate.

In accordance with an added mode of the invention, there is provided a method which comprises bonding other wires to a metal base plate, laterally fixing the substrate to the metal base plate with the other wires, and materially joining the substrate to the metal base plate.

In accordance with an additional mode of the invention, there is provided a method which comprises mounting the semiconductor bodies on one side of the substrate and mounting the other side of the substrate on the base plate, with a solder having the same melting point.

In accordance with a concomitant mode of the invention, there is provided a method which comprises mounting the semiconductor bodies on the substrate and mounting the substrate on the base plate, simultaneously.

Other features which are considered as characteristic for the invention are set forth in the appended claims.

Although the invention is illustrated and described herein as embodied in a method for mounting semiconductor bodies on a substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
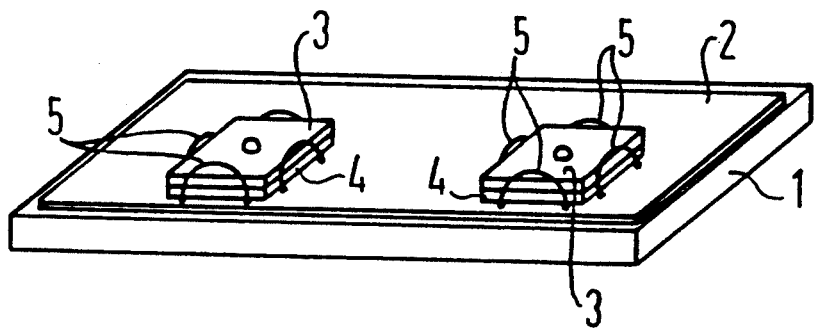
FIG. 1 is diagrammatic, perspective of a first embodiment of a semiconductor body mounted on a substrate.

Referring now to the figures of the drawing in detail and first, particularly, to FIG. 1 thereof, there is seen an exemplary embodiment of a device produced according to the method of the invention, having a substrate 1 which, by way of example, is formed of an insulating ceramic such as $Al_2O_3$. The substrate 1 has a metal layer 2 on its main surface. Two semiconductor bodies 3, which are to be joined to the metal layer 2 by solder foils 4, are seated on the metal layer 2.

In order to provide lateral fixation of the semiconductor bodies 3 on the substrate 1, wires 5 are bonded to the metal layer 2. The position of these bonded wires is selected in such a way that they can receive the semiconductor bodies substantially without lateral play. After the wires 5 have been bonded, the solder foils 4 are placed within the wires and the semiconductor bodies 3 are disposed on the solder foils 4. Subsequently, the semiconductor bodies 3 can be soldered to the substrate 1, for instance in a through-type furnace.

In a similar way, the semiconductor bodies 3 can be joined to the substrate 1 by material joining methods other than soldering, such as by adhesive bonding or by sintering using metal powder. The bonded wires may be bonded to the metal layer 2 on both sides as shown, but bonding on only one side is also possible, if the bonder is capable of severing the bonded wire above the substrate.

As is shown in FIG. 1, the wires 5 that are bonded to the metal may form a loop, which is higher than the total thicknesses of the solder layer 4 and the semiconductor body 3. However, the loop may also be lower in height, as long as lateral fixation of the semiconductor bodies 3 remains assured.

The substrate in FIG. 1 is shown with a metal layer over its entire surface. Typically, however, the metal layer 2 will be structured, as is known from semiconductor modules. However, in any case the surface of the metal layer 2 must be large enough to allow the wires 5 next to the semiconductor bodies to be bonded to the metal layer. The metal layer is formed of a metal on which bonding can be performed, such as aluminum or nickel-plated copper.

In a departure from the view of FIG. 1, the substrate may also be entirely of metal. In that case as well, the metal is selected in such a way that bonding can be performed on it. Again, aluminum or nickel-plated copper can be considered.

Figure 2:
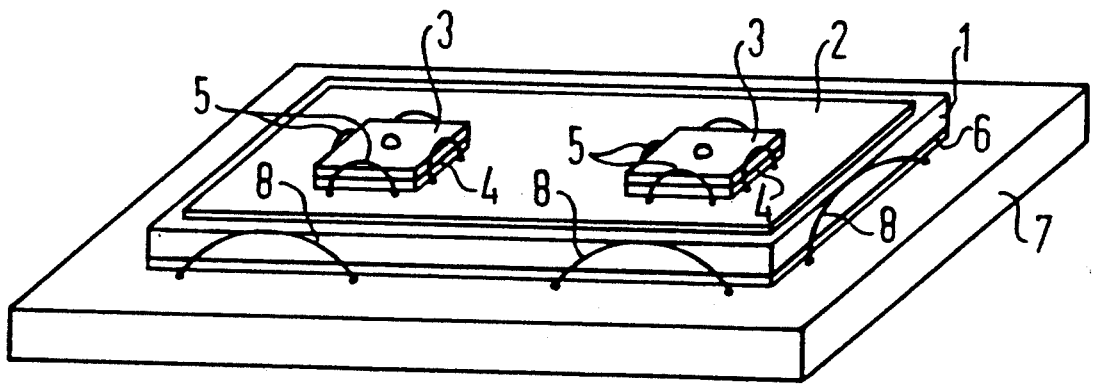
FIG. 2 is a perspective view of a second embodiment in which the semiconductor body and the substrate of FIG. 1 are mounted on a metal base plate.

In FIG. 2, a configuration is shown in which the device of FIG. 1 is seated on a metal base plate 7. The substrate 1 is materially joined to the base plate 7 with a solder layer 6, by adhesive bonding or sintering. In order to provide lateral fixation of the substrate 1 on the base plate 7, wires 8 are bonded to the base plate 7. Analogously to the position of the wires 5, the wires 8 are dimensioned in such a way that they are capable of receiving the substrate 1 and fixing it laterally. The base plate 7 is again formed of a metal on which bonding can be performed, such as nickel-plated copper.

Besides providing an ease of fixation of the smaller parts on the larger part, the method of the invention has the advantage of permitting the semiconductor bodies 3 to be joined to the substrate 1 on one side, while the substrate 1 can be simultaneously joined to the base plate 7 on the other side, in one and the same operation. This is preferably done by making the solder layers or solder foils 4 and 6 of solders having the same melting point, and preferably by making them of the same solder. This requires only a single temperature treatment, which can sometimes favorably affect the electrical properties of the semiconductor module.

We claim:

1. A method for mounting semiconductor bodies on a substrate, which comprises:

bonding wires to a substrate being formed of metal at least in given locations;

laterally fixing semiconductor bodies to the given locations of the substrate with the wires; and subsequently materially joining the semiconductor bodies to the substrate in the given locations.

2. The method according to claim 1, which comprises bonding two ends of the wires to the substrate.

3. The method according to claim 1, which comprises bonding one end of the wires to the substrate.

4. The method according to claim 1, which comprises bonding other wires to a metal base plate, laterally fixing the substrate to the metal base plate with the other wires, and materially joining the substrate to the metal base plate.

5. The method according to claim 4, which comprises mounting the semiconductor bodies on one side of the substrate with a first solder, and mounting the other side of the substrate on the base plate, with a second solder having the same melting point as the first solder.

6. The method according to claim 5, which comprises mounting the semiconductor bodies on the substrate and mounting the substrate on the base plate, simultaneously.

* * * * *